United States Patent
Faist et al.

(10) Patent No.: US 11,070,030 B2
(45) Date of Patent: Jul. 20, 2021

(54) WAVEGUIDE HETEROSTRUCTURE FOR DISPERSION COMPENSATION IN SEMICONDUCTOR LASER

(71) Applicant: ETH Zürich, Zürich (CH)

(72) Inventors: Jérôme Faist, Zürich (CH); Yves Bidaux, Zürich (CH); Filippos Kapsalidis, Zürich (CH)

(73) Assignee: Eth Zürich, Zürich (CH)

( * ) Notice: Subject to any disclaimer, the term of this patent is extended or adjusted under 35 U.S.C. 154(b) by 0 days.

(21) Appl. No.: 16/652,514

(22) PCT Filed: Sep. 27, 2018

(86) PCT No.: PCT/EP2018/076281
§ 371 (c)(1),
(2) Date: Mar. 31, 2020

(87) PCT Pub. No.: WO2019/068554
PCT Pub. Date: Apr. 11, 2019

(65) Prior Publication Data
US 2020/0287353 A1    Sep. 10, 2020

(30) Foreign Application Priority Data
Oct. 2, 2017 (EP) .................... 17194352

(51) Int. Cl.
| | |
|---|---|
| H01S 5/34 | (2006.01) |
| H01S 5/00 | (2006.01) |
| H01S 5/10 | (2021.01) |
| H01S 5/227 | (2006.01) |
| H01S 5/32 | (2006.01) |

(52) U.S. Cl.
CPC .......... *H01S 5/3412* (2013.01); *H01S 5/0035* (2013.01); *H01S 5/1032* (2013.01); *H01S 5/227* (2013.01); *H01S 5/3214* (2013.01); *H01S 5/3216* (2013.01); *H01S 5/3401* (2013.01)

(58) Field of Classification Search
CPC ...... H01S 5/3412; H01S 5/227; H01S 5/0035; H01S 5/3216
USPC ................................. 372/43.01, 50
See application file for complete search history.

(56) References Cited

U.S. PATENT DOCUMENTS

| | | | | |
|---|---|---|---|---|
| 6,849,866 B2 * | 2/2005 | Taylor | ................. | H01L 29/7785 257/184 |
| 8,780,949 B2 * | 7/2014 | Takagi | .................. | B82Y 20/00 372/50.1 |
| 2004/0082091 A1 * | 4/2004 | Taylor | ..................... | H03M 1/74 438/39 |

(Continued)

OTHER PUBLICATIONS

International Search Report dated Nov. 28, 2018 for PCT/EP2018/076281 filed Sep. 27, 2018.

(Continued)

*Primary Examiner* — Tuan N Nguyen
(74) *Attorney, Agent, or Firm* — Renner, Otto, Boisselle & Sklar, LLP

(57) ABSTRACT

A waveguide heterostructure for a semiconductor laser with an active part, comprising an active region layer depending of the type of semiconductor used, which is sandwiched between an electrode layer and a substrate, usable for dispersion compensation in a semiconductor laser frequency comb setup, an optical frequency comb setup and a manufacturing method.

18 Claims, 7 Drawing Sheets

(56) References Cited

U.S. PATENT DOCUMENTS

| | | |
|---|---|---|
| 2006/0056477 A1 | 3/2006 | Lammert et al. |
| 2006/0141651 A1* | 6/2006 | Taylor ................. H01L 29/0821 |
| | | 438/47 |
| 2014/0240509 A1 | 8/2014 | Nakayama |
| 2016/0156153 A1 | 6/2016 | Belkin et al. |

OTHER PUBLICATIONS

Written Opinion for PCT/EP2018/076281 filed Sep. 27, 2018.
International Preliminary Report dated Apr. 8, 2020 with Written Opinionfor PCT/EP2018/076281 filed Sep. 27, 2018.

* cited by examiner

WAVEGUIDE HETEROSTRUCTURE FOR DISPERSION COMPENSATION IN SEMICONDUCTOR LASER

TECHNICAL FIELD

The present invention describes a waveguide heterostructure for a semiconductor laser with an active part, comprising an active region layer depending of the type of semiconductor used, which is sandwiched between an electrode layer and a substrate, usable for dispersion compensation in a semiconductor laser frequency comb setup, an optical frequency comb setup and a manufacturing method.

STATE OF THE ART

The generation of optical frequency combs via direct electrical pumping of semiconductor lasers is considered an attractive alternative to the well established mode-locked laser sources that are Ti:sapphire or dye lasers in terms of compactness, robustness and integrability. However, the high chromatic dispersion of bulk semiconductor materials can prevent the propagation of frequency combs or lead to undesired pulse lengthening.

In semiconductor laser frequency combs, in particular quantum cascade laser (QCL) frequency combs the mode-locking mechanism is the fourth wave mixing due to the high non-linearity of intersubband transitions. Efficient fourth wave mixing can only be obtained in frequency comb setups with quantum cascade lasers, if the group velocity dispersion inside the laser waveguide structure is sufficiently low. For interband lasers mode-locking is reached by the use of an integrated saturable absorber.

According to prior art, for improvement of optical frequency comb operation, waveguide structures, comprising multi-layer dielectric coatings were deposited directly on the lasers back facets. The fabrication of high quality GTI coatings, working like Gires-Tournois-Interferometer (GTI), is challenging since due to the optical absorption of the materials used they overheat and burn. These are therefore incompatible with high optical output power and alternative solutions are required.

Also Plasmon enhanced waveguides structures were optimized for low group velocity dispersion. But Plasmon enhanced waveguide structures cannot be used for low mid-infrared wavelengths due to the difficulty to increase the plasmon frequency accordingly.

Quantum cascade laser based frequency comb sources have been demonstrated in the mid-infrared and terahertz spectral ranges. Dual comb spectroscopy setups based on these devices were demonstrated, showing their strong potential for the development of spectrometers based on broadband QCLs.

At mid-infrared wavelengths the most efficient waveguides for QCLs are dielectric slab waveguide heterostructures. For the InGaAs/AlInAs material system, the active region is placed in between two InP layers, which act as bottom and top cladding layers. In the active region electrons are transformed to photons. Most of the time, thin layers of InGaAs are grown between the active region and the InP cladding layers in order to increase the refractive index contrast and therefore the optical confinement. Sometimes a low doped substrate is used as bottom cladding on which the active region is directly grown. For best performances, a low doped InP bottom cladding is grown on the InP substrate, before the growth of the active region. Finally, in order to lower losses due to the interaction with surface plasmon modes in the contact layer, a highly doped InP layer is usually grown on top of the top cladding. This waveguide heterostructure comprises an active region sandwiched in two cladding layer, wherein the sandwich lays between the substrate and an electrode layer. Such a waveguide heterostructure can be used in a frequency comb setup, but the reachable group velocity dispersion (GVD) inside the laser waveguide heterostructure could not be reduced to low enough values so far.

In US2014240509 a multiplicity of waveguide structures is disclosed and depicted, based on GaAs and AlGaAs. All presented waveguide structures have a layered form, comprising a substrate, a buffer layer, a first cladding layer, a core layer, a second cladding layer, a cap layer, an insulating layer and two electrodes. In the disclosed waveguide structures pulse compression is realized after the light has left the laser, wherein the means are not part of the laser cavity and therefore do not allow to realize compensation of the chromatic dispersion of the laser cavity.

DESCRIPTION OF THE INVENTION

The object of the present invention is to improve an optical frequency comb setup and a laser device, comprising a semiconductor laser with an optimized waveguide heterostructure, lowering the group velocity dispersion in a broad spectral range. An optical waveguide heterostructure of a semiconductor laser as disclosed herein solves this problem.

Reachable semiconductor laser frequency comb setups according to the invention, based on the improved waveguide heterostructure have more spectral bandwidth and more optical output power, in comparison with prior art solutions.

Moreover, it will secure exclusivity for short wavelengths (3-7 μm) since no quantum cascade laser based frequency combs were available prior due to the high dispersion. Moreover, the use of the improved waveguide heterostructure can be used to reduce the dispersion of near-infrared mode-locked lasers and therefore lead to shortening of the pulse length in these devices.

The optical waveguide heterostructure can be applied to different semiconductor lasers such as quantum well, quantum dash, quantum dot, interband cascade or quantum cascade lasers.

Such semiconductor laser frequency comb setups can comprise different semiconductor lasers such as interband cascade lasers and quantum dot lasers. The disclosed solution is fully compatible with standard quantum cascade lasers fabrication processes used for commercially available laser devices.

We have invented a novel wave guiding structure for semiconductor lasers which is able to compensate the group velocity dispersion in these devices and improve their performance as frequency combs. A secondary waveguide core is fabricated close to the standard active region primary core. Together, the two waveguides result in a coupled waveguide for which the fundamental mode dispersion can be tuned by varying the secondary core waveguide geometries and the distance between primary core and secondary core. The use of this effect makes possible heterostructures that have optimized group velocity dispersion for frequency comb operation in semiconductor lasers.

The here presented semiconductor laser frequency comb setup will be used in an optical spectrometer.

The integration of coupled waveguides in the laser waveguide heterostructure is not trivial.

In such a structure two optical modes have identical losses and therefore reach threshold simultaneously. These are the antisymmetric mode which has negative GVD and the symmetric mode which has positive GVD.

The heterostructure here achieves mode selection on the antisymmetric and the antisymmetric mainly located in the active region waveguide core which allows to achieve laser operation with high performance.

BRIEF DESCRIPTION OF THE DRAWINGS

Preferred exemplary embodiments of the subject matter of the invention are described below in conjunction with the attached drawings.

Figure 1:
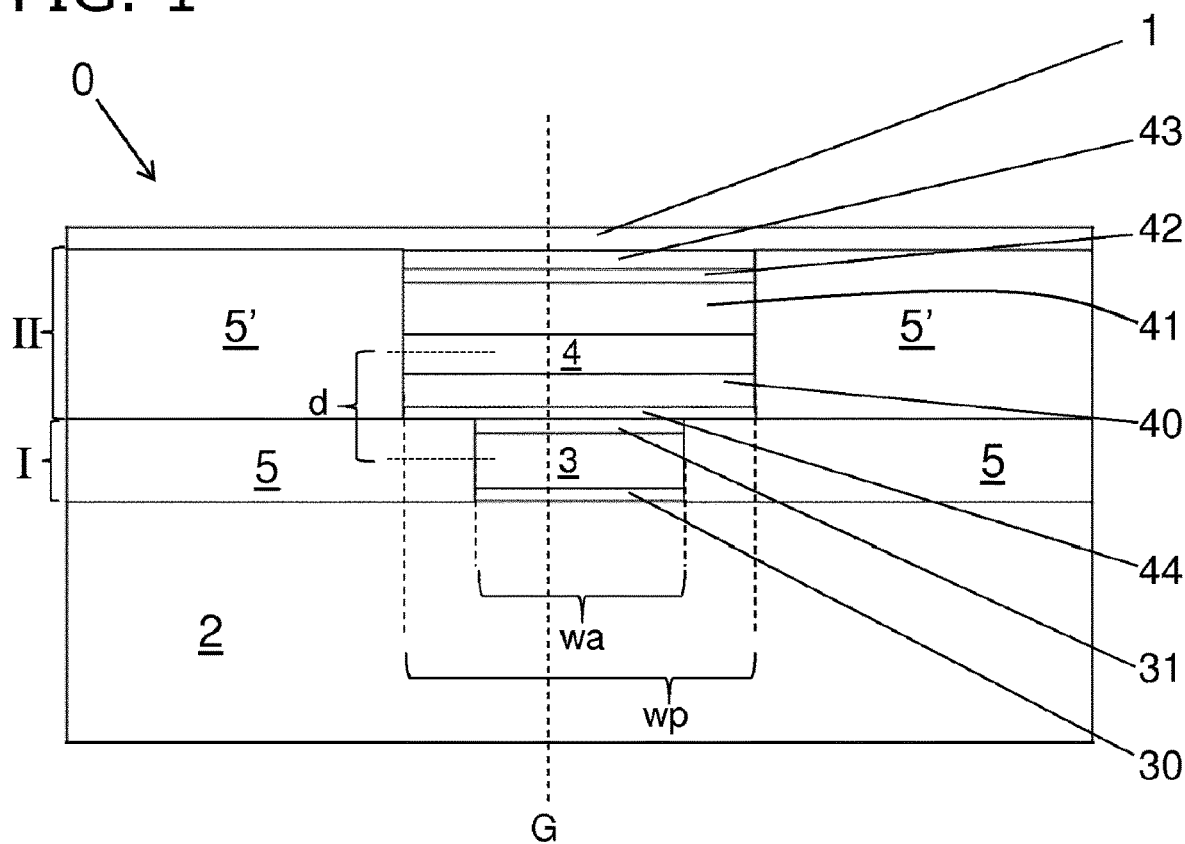
FIG. 1 shows a scheme of a waveguide heterostructure according to a first embodiment in form of a buried heterostructure quantum cascade laser (QCL).

4B shows a vertical cut plan of the intensity profile of the mode for the active region core layer without the passive core layer (GaAs waveguide) and respective refractive index profile.

4C shows a vertical cut plan of the intensity profile of the mode for the passive core layer (GaAs waveguide) without the active region core layer and respective refractive index profile.

4D Intensity profile of Mode (−) at 8600 cm$^{-1}$.

4E Intensity profile of Mode (+) at 8600 cm$^{-1}$.

4F Spectrally resolved dispersion of the waveguides modes. The coupling of Mode 1 and Mode 2 results into the generation of two hybrid modes (−) and (+).

4G Overlap factor with the active region core layer.

4H GVD of the modes. The induced GVD is positive for the upper branch mode (+) and negative for the lower branch Mode (−).

DESCRIPTION

We present different semiconductor laser, comprising an optical waveguide heterostructure 0, 0' in different embodiments as part of semiconductor laser of different types. Such waveguide heterostructures 0, 0' can form part of laser devices for semiconductor laser frequency comb setups. The waveguide heterostructures 0, 0' have a layered setup, comprising different layer of different materials grown on a substrate 2, 2' in direction of a growth axis G with a height and variable width, as depicted in the schematic cross section views FIGS. 1 and 2. The waveguide heterostructure 0, 0' is a dual coupled waveguide for a semiconductor laser, comprising an active part I and a passive part II in a layered structure. The active part I comprises a cladded active region layer 3, 3' and the passive part II comprises a cladded passive core layer 4, 4' deposited onto another. Such a waveguide heterostructure 0, 0' is usable for dispersion compensation in semiconductor lasers.

Known semiconductor laser comprising quantum cascade laser (QCL) and quantum dot (QD) laser. In general quantum cascade laser are using an active part I/waveguide core with active region layer 3 comprising quantum wells, the active region layer 3' of quantum dot lasers comprises quantum dots as active laser medium for light emission.

A first embodiment of waveguide heterostructure 0 is based on an active region layer 3, also named as primary core, of a buried heterostructure quantum cascade laser (QCL), wherein the active region layer 3 is sandwiched between an electrode layer 1 on one side and a substrate 2 on the other side in direction of the growth axis G. All depicted layer are grown in direction of the growth axis G and are proceeding in longitudinal direction of the waveguide heterostructure 0. In the active region layer 3 of quantum cascade laser, the optical amplification takes place. Such active region layer 3 of quantum cascade laser are known to the person skilled in the art, in which laser emission in a repeated stack of semiconductor multiple quantum well heterostructures is achieved through, using intersubband transitions. There are setups known for forming superlattices in the active region layer 3 of a QCL, to reach intersubband transitions and tune an emission wavelength.

The active region layer 3 is in direction of the growth axis G surrounded by an active part bottom cladding 30 and an active part top cladding 31, building the active part I. A lateral regrowth layer 5 is surrounding the active part I with active region layer 3 and surrounding active bottom and top cladding 30, 31 laterally parallel to an active region layer 3 plane. On top of the active region layer 3, above the active part top cladding 31 a passive part II, comprising a passive core layer 4, surrounded both-sided by at least an intercladding layer 40 and a passive top cladding 41 is placed. Here additional passive part claddings 42, 43 are deposited on top of the passive top cladding 41, while an additional passive part cladding 44 is placed underneath the intercladding layer 40. Another lateral regrowth layer 5' is surrounding the passive part II with passive core layer 4 and the surrounding passive cladding layer 40, 41, 42, 43, 44 laterally parallel to an passive core layer 4 plane.

The electrode layer 1 covers the passive part II on the side facing away the active region layer 3, while the substrate 2 is covering the active part I. The width wa of the active part I respectively of the active region layer 3 can be smaller or larger than the width wp of the passive part II respectively the passive core layer 4. As depicted in FIG. 1 wa is smaller than wp.

A distance d between the centre of the active core layer 3 and the centre of the passive core layer 4 is defined, lying at coupling distance, roughly between 100 nm and 5 microns, in particular below 2000 nm.

The electrode layer 1 comprises a metal, in particular gold, while all other layers are made of semiconducting material with partly differing doping. We found an optimized waveguide heterostructure comprising the QCL active part I, InGaAs comprising passive core 4 and InP claddings and the substrate from InP as promising setup.

An example of a preferred detailed material mix of the optical waveguide heterostructure 0 according to the first embodiment is depicted in table I and FIG. 1, showing a schematic vertical cross section of waveguide heterostructure for a 4.6 μm quantum cascade laser. This waveguide heterostructure is based on InGaAs/InP and a quantum cascade layer as active region layer 3.

TABLE I

| Layer | Material | Thickness | Doping |
|---|---|---|---|
| metal electrode layer 1 | Metal/Au | 0.3 μm | |
| additional passive part cladding 43 | InP | 0.4 μm | n = 3e18 cm$^{-3}$ |
| additional passive part cladding 42 | InP | 0.4 μm | n = 2e17 cm$^{-3}$ |
| passive top cladding 41 | InP | 1.6 μm | n = 1e16 cm$^{-3}$ |
| passive core 4 | InGaAs | 1.0μ | n = 1e16 cm$^{-3}$ |
| passiv bottom cladding 40 (multiple layer) | InP | 1.2 μm | n = 1e16 cm$^{-3}$ |
| active part top cladding 31 | InGaAs | 0.1 μm | n = 6e16 cm$^{-3}$ |
| active region of QCL 3 | | 1.8 μm | |
| active part bottom cladding 30 | InGaAs | 0.1 μm | n = 6e16 cm$^{-3}$ |
| substrate 2 | InP | Variable | n = 2e17 cm$^{-3}$ |

Optionally a bottom cladding layer of InP with a thickness of a few microns, in particular 2.5 microns, can be placed between substrate 2 and active part bottom cladding 30.

All cladding layer 30, 31, 40, 41, 42, 43, 44 are optical passive cladding layer, independent, if they belong to the active part I or passive part II. As shown in table I, all layers, other than the electrode layer 1 are semiconducting.

A second embodiment of a waveguide heterostructure 0' is based on an active region layer 3' of a ridge waveguide quantum dot (QD) laser. Also here the active region layer 3' is sandwiched between an electrode layer 1 on one side and a substrate 2' on the other side in direction of a growth axis G. All depicted layers are grown in direction of the growth axis G and are proceeding in longitudinal direction of the waveguide heterostructure 0'. Quantum dots are arranged in the active region layer 3', in which the optical amplification takes place. Also different active region layer 3' of quantum dot lasers are known to the person skilled in the art. The active part I' is comprising an active part bottom cladding 30' and an active part top cladding 31' surrounding the active region 3' in direction of the growth axis G on two sides. Here a bottom cladding bc is arranged between the active part bottom cladding 30' and the substrate 2'. The bottom cladding bc is not a part of the active part I'.

Onto the active part I respectively onto the upper surface of the active part top cladding 31', facing away the substrate side of active region layer 3', the layered passive part II' is deposited. The passive part II' comprises a passive core layer 4' surrounded by an intercladding layer 40' and a passive top cladding 41 on its both sides along the growth axis G. Here the passive core layer 4' width wp' is greater than the active layer 3' width wa'. The distance d' between the centres of the active region layer 3' and the passive core layer 4' is depicted, lying at coupling distance.

Figure 2:
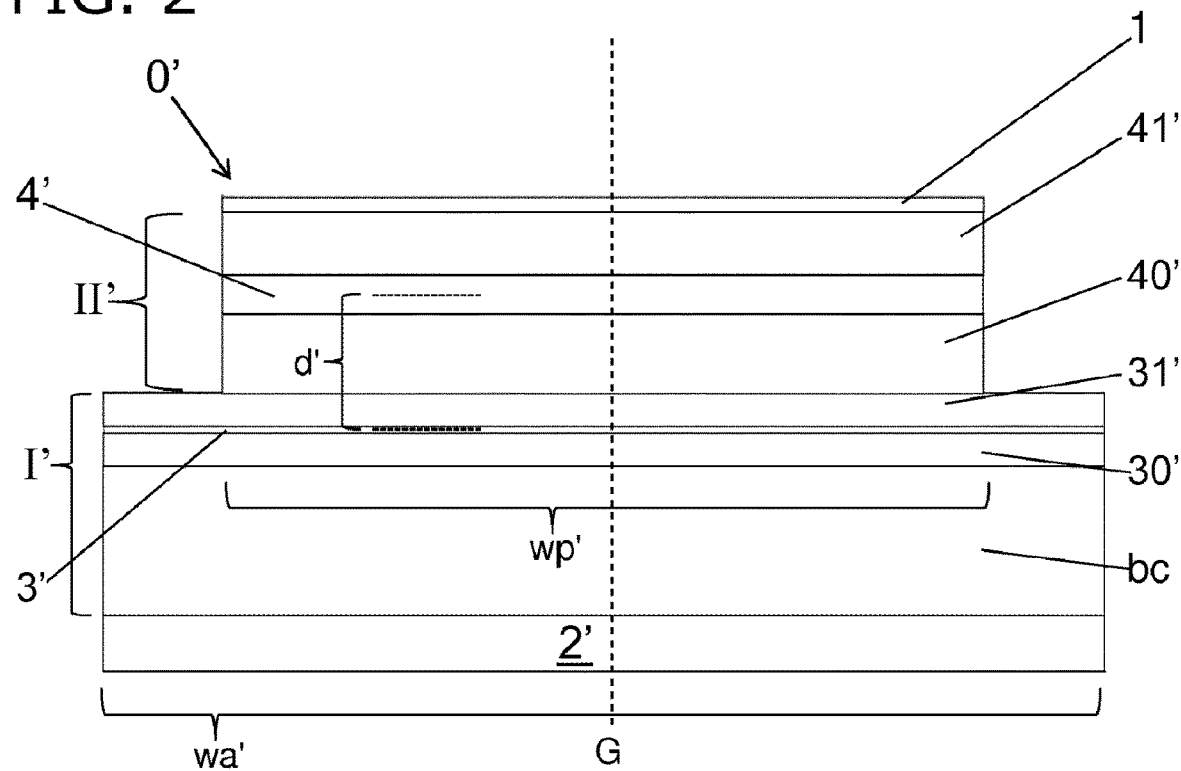
FIG. 2 shows a scheme of a waveguide heterostructure according to a second embodiment in form of a ridge waveguide QD laser.

The schematic vertical cross section according to FIG. 2 shows the second embodiment of a waveguide heterostructure 0', based on GaAs/AlxGayAs for passive core layer 4' and cladding layer 30', 31', 40', 41', with a known quantum dot layer as active region layer 3'. An example of a preferred detailed material mix of the optical waveguide heterostructure 0' according to the second embodiment is depicted in table II and FIG. 2.

TABLE II

| Layer | Material | Thickness | Doping |
|---|---|---|---|
| metal electrode layer 1 | Au | 0.3 μm | |
| passive top cladding 41' | Al$_{0.35}$Ga$_{0.65}$As | 0.76 μm | n = 1e17 cm$^{-3}$ |
| passive core layer 4' | GaAs | 0.6 μm | n = 1e17 cm$^{-3}$ |
| intercladding layer 40' | Al$_{0.35}$Ga$_{0.65}$As | 0.56 μm | n = 1e17 cm$^{-3}$ |
| active part top cladding 31' | Al$_{0.15}$Ga$_{0.85}$As | 0.3 μm | n = 1e17 cm$^{-3}$ |
| active region layer (QD) 3' | | 0.07 μm | |
| active part bottom cladding 30' | Al$_{0.15}$Ga$_{0.85}$As | 0.3 μm | p = 1e18 cm$^{-3}$ |
| bottom cladding bc | Al$_{0.35}$Ga$_{0.65}$As | 1.52 μm | p = 1e18 cm$^{-3}$ |
| Substrate 2' | GaAs | | p = 1e18 cm$^{-3}$ |

All cladding layer 30', 31', bc, 40', 41' are optical passive cladding layer, independent, if they belong to the active part I or passive part II. As shown in table II, all layers, other than the electrode layer 1 are semiconducting with variable doping.

All Embodiments

In all embodiments in the active part 3, 3', respectively the active region layer 3, 3' optical amplification takes place. Possible active region layer 3, 3' are quantum cascade structures, an interband cascade structure, a quantum well structure, a quantum dash structure, a quantum dot structure or any other possible structure providing gain in semiconductor lasers. The passive core layer 4, 4' is a layer which confines light and provides neither significant gain or losses. The waveguide heterostructure 0, 0' have to comprise one active region layer 3, 3' (primary core region), at least one passive core layer 4, 4' (secondary core region) and the cladding. By tuning the coupling strength of the two optical modes located in each separated core, their dispersion slope can be modulated.

The passive core layer 4, 4' geometries and position relative to the active region layer 3, 3' in direction of the growth axis G can be tuned in order to optimize the group velocity dispersion of the fundamental mode of the active region layer 3, 3'.

A semiconductor laser with novel waveguide heterostructure 0, 0' provides an optimized group velocity dispersion for frequency comb operation.

In General the width wa, wa' and wp, wp' can have a value between the wavelength of the laser up to 15 times the wavelength of the laser.

Typical distances d, d' are at a coupling distance, from 100 nm up to 1.5 times the wavelength of the laser, roughly between 100 nm and 5 microns, in particular below 2000 nm.

Although the passive part II is here as depicted always located in growth direction G above the active part I the other orientation is also possible.

Refractive Index Relation

Concerning refractive indices of the different layer, examples are depicted in FIGS. 3A-3H and 4A-4H.

In a QCL setup grown on InP the refractive index of the substrate 2 n(2) is less than the refractive index of active region layer 3 (n(3)), passive core layer 4 (n(4)), and refractive indices of active part bottom cladding 30 (n(30)) and active part top cladding 31 (n(31)).

In a QD setup, grown on GaAs, the substrate 2 has a high refractive index and the use of a cladding is mandatory.

The refractive indices of active region layer 3 (n(3)), passive core layer 4 (n(4)), and refractive indices of active part bottom cladding 30 (n(30)) and active part top cladding 31 (n(31)) are greater than the refractive indices of intercladding layer 40 (n(40)), passive part top cladding 41 (n(41)) and the additional passive part claddings 42, 43, 44 (n(42), n(43), n(44))

In case the bottom cladding be is used, the associated refractive index n(bc) is less than the refractive indices n(3), n(4), n(30) and n(31).

Optionally the refractive index of active region layer 3 can be smaller than the refractive index of the passive core layer 4.

Simulation Results of First Embodiment/FIGS. 3A-3H

We simulated the optical modes for various geometries using a finite element solver and targeted zero GVD at the central wavelength. The structure optimized for low GVD at 4.6 µm is detailed in Table I. This is an example of a QCL with a described waveguide heterostructure emitting at 4.6 µm.

The active region layer 3 width is 4 µm and the passive core layer 4/InGaAs secondary waveguide width is 6.7 µm.

Figure 3A:
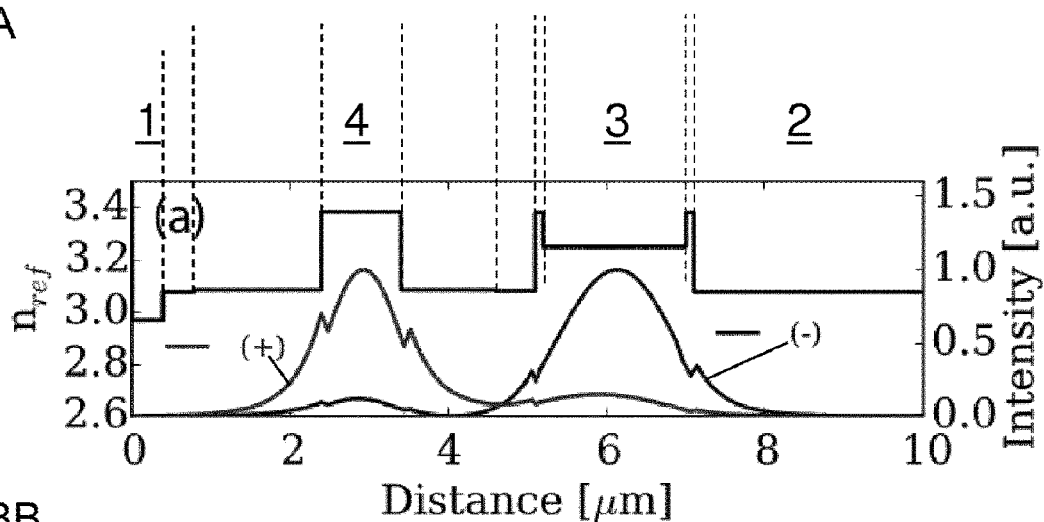
FIGS. 3A-3H are showing 3A refractive index and mode intensity along the growth axis in an exemplary 4.6 μm QCL with waveguide structure according a first embodiment for the fundamental mode of the primary and secondary cores, 3B refractive index and mode intensity along the growth axis in an exemplary 4.6 μm QCL with waveguide heterostructure according to first embodiment without passive core layer/secondary core, 3C refractive index and mode intensity along the growth axis in an exemplary 4.6 μm QCL with waveguide heterostructure according to first embodiment without active region layer, 3D the 2D mode intensity of the fundamental mode of the passive core layer in an exemplary 4.6 μm QCL with waveguide heterostructure 3E the 2D and mode intensity of the fundamental mode of the active region layer in an exemplary 4.6 μm QCL with waveguide heterostructure 3F the effective refractive index dispersion of the optical modes 3G the overlap with active gain region FAR of the optical modes 3H the group velocity dispersion of the optical modes according to this first embodiment of the invention.
Figure 3B:
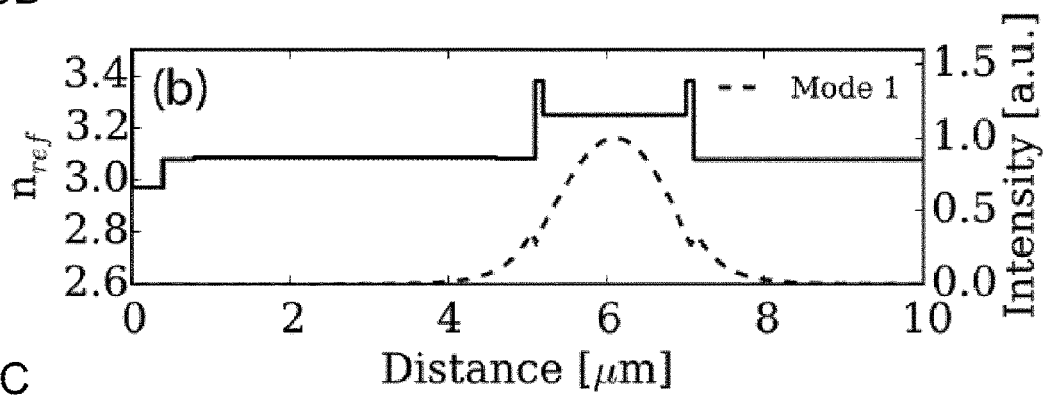
Figure 3C:
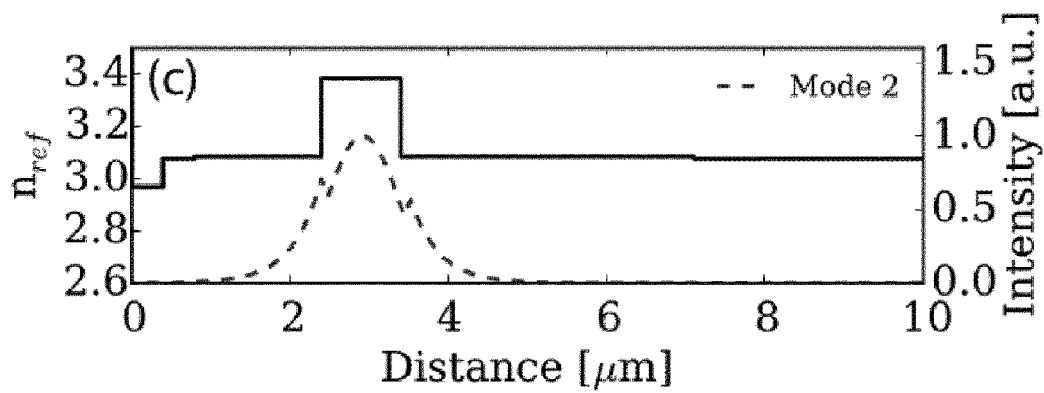
Figure 3D:
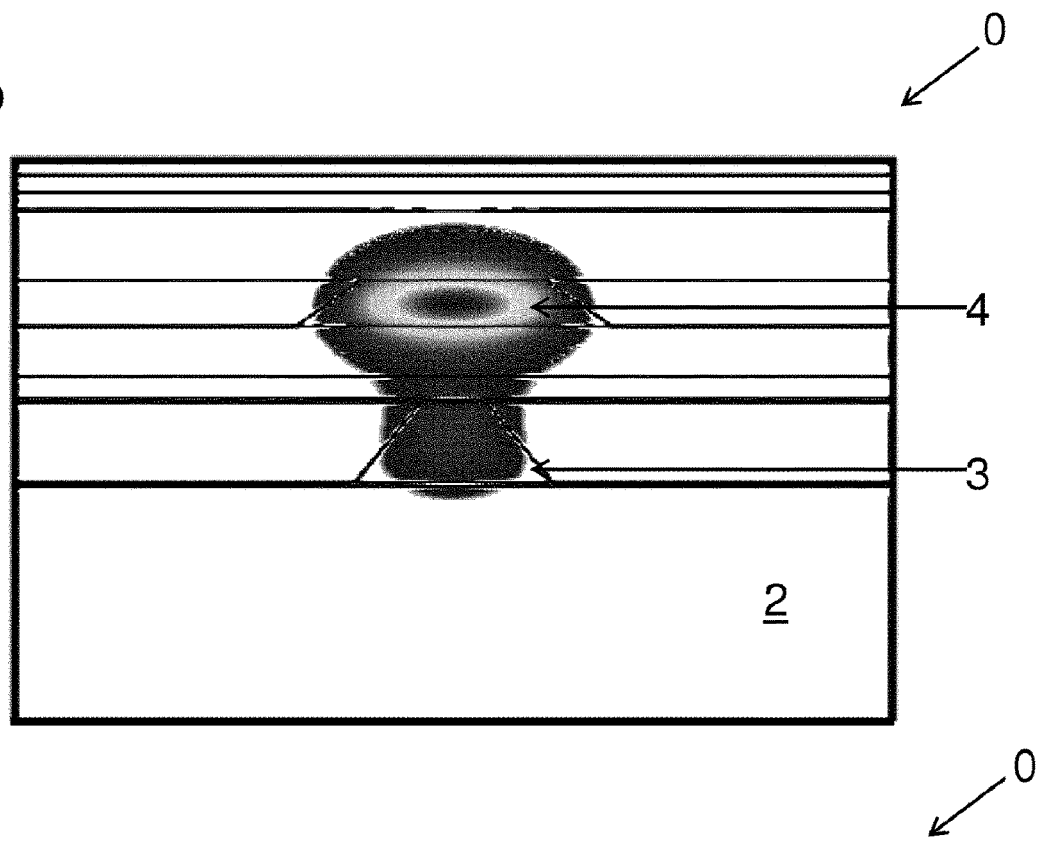
Figure 3E:
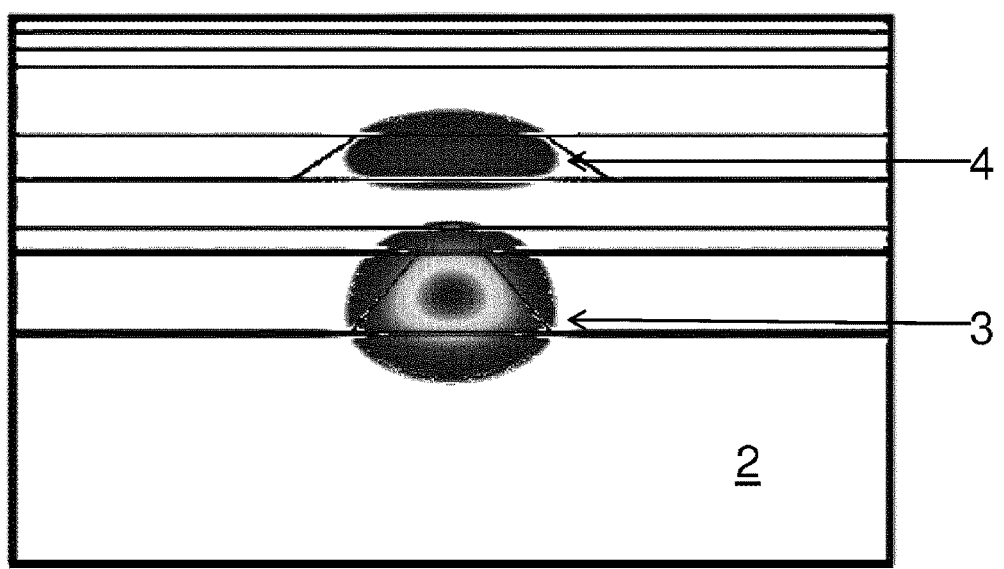

The refractive index profile along the growth axis G is displayed in FIG. 3A. The computed intensity profile of the antisymmetric (−) and symmetric (+) modes are also displayed, while the full two dimensional intensity profiles of these modes are reported in FIGS. 3D and 3E. These two modes result from the coupling of the fundamental modes (Mode 1 and Mode 2) of the two distinct waveguides with GVD $D_1$=1140 fs$^2$/mm and $D_2$=2600 fs$^2$/mm.

Figure 3F:
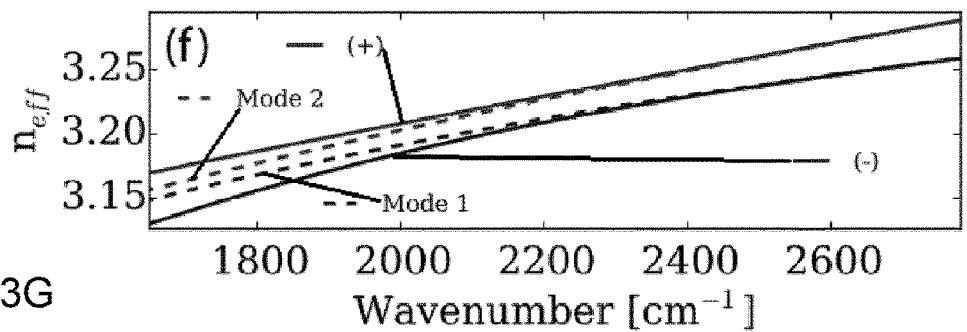

The dispersion lines of the two uncoupled modes are reported in FIG. 3F, with dashed lines while the dispersion of the coupled modes are reported with full lines.

Figure 3G:
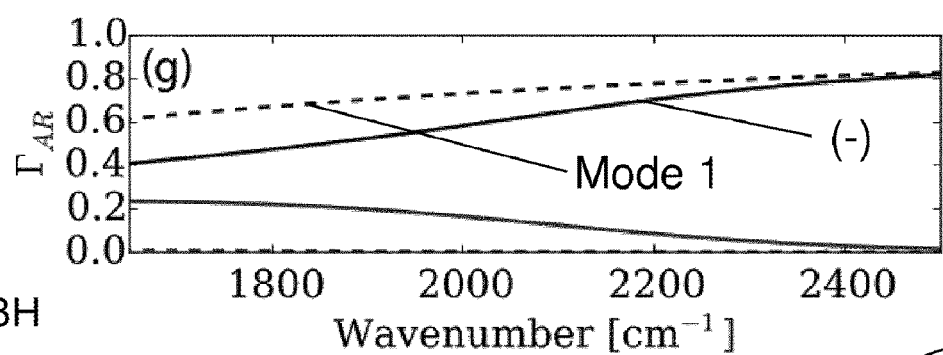
Figure 3H:
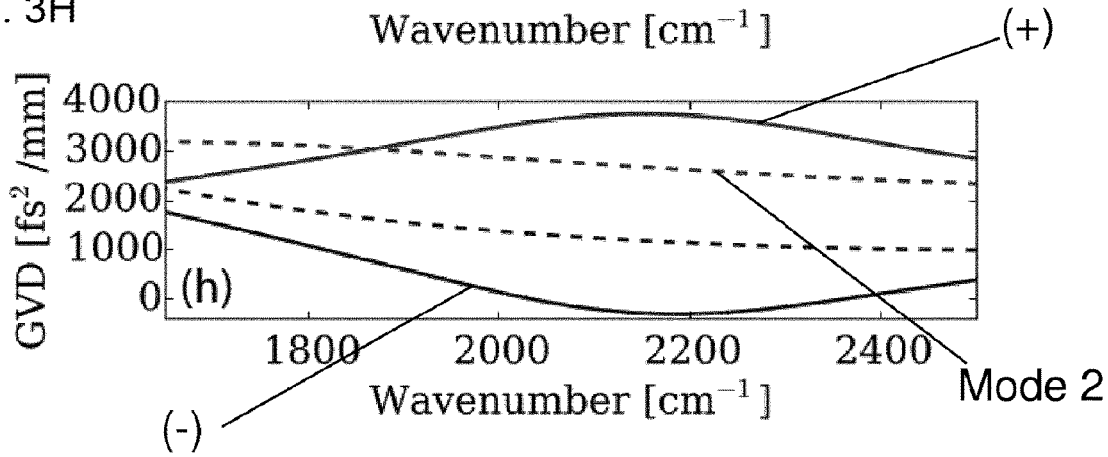

Our simulation predicts a minimum of the GVD close to zero at the laser operation wavelength for the antisymmetric mode (−) (see FIG. 3H) while the overlap with the active region is almost fully preserved (see FIG. 3G). In turn, the antisymmetric mode (−) has a much larger overlap with the active region $\Gamma_{AR}$ than the symmetric mode (+) which is localized in the passive core layer 4/InGaAs waveguide. This induces a strong mode selection mechanism which ensures that the device operates with high efficiency on the low GVD antisymmetric mode (−).

We propose anoptical waveguide heterostructure 0", in form of a dual waveguide for GaAs/AlGaAs quantum dot lasers. The proposed active region layer 3" is composed of a 643 nm thick layer $Al_{0.15}Ga_{0.85}As$. This is an example of a QD laser with a described waveguide heterostructure emitting at 1.3 µm.

The active region layer 3" (core waveguide) is placed in between two $Al_{0.35}Ga_{0.25}$ 1520 nm cladding layers (Si doped n=10$^{17}$ cm$^{-3}$ and C doped p=10$^{18}$ cm$^{-3}$) 30", 31".

A 360 nm passive core layer 4" (GaAs waveguide) is placed in the upper cladding layer 41" at a distance d=700 nm to the active region layer 3" (primary core waveguide).

Figure 4A:
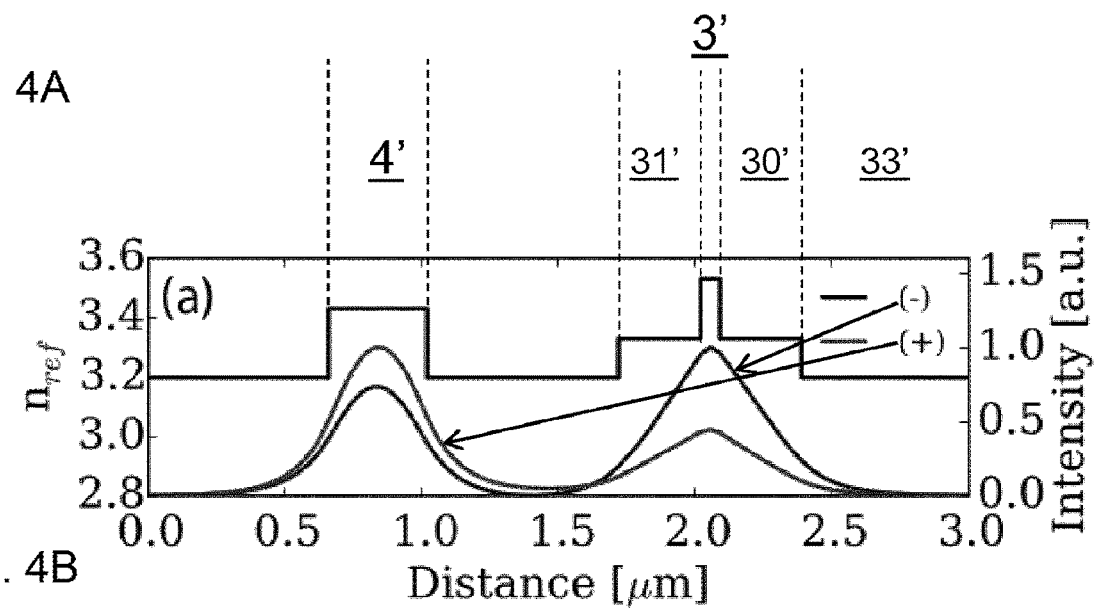
FIGS. 4A-4H are showing a third embodiment of a waveguide heterostructure, wherein 4A shows a vertical cut plan of the intensity profile of Modes (−) and (+) and respective refractive index profile.
Figure 4B:
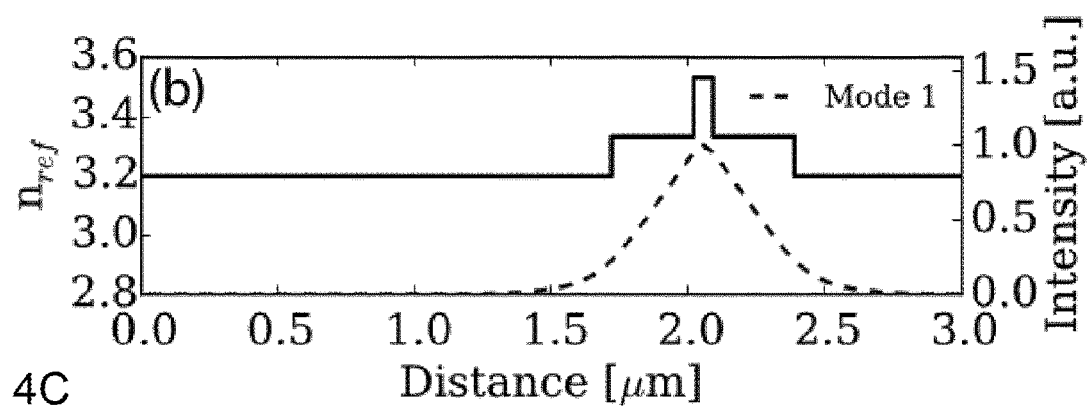
Figure 4C:
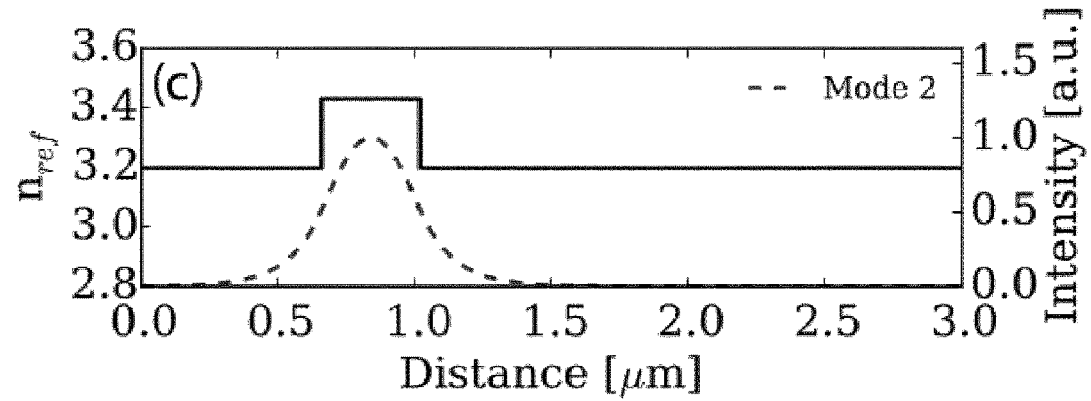
Figure 4D:
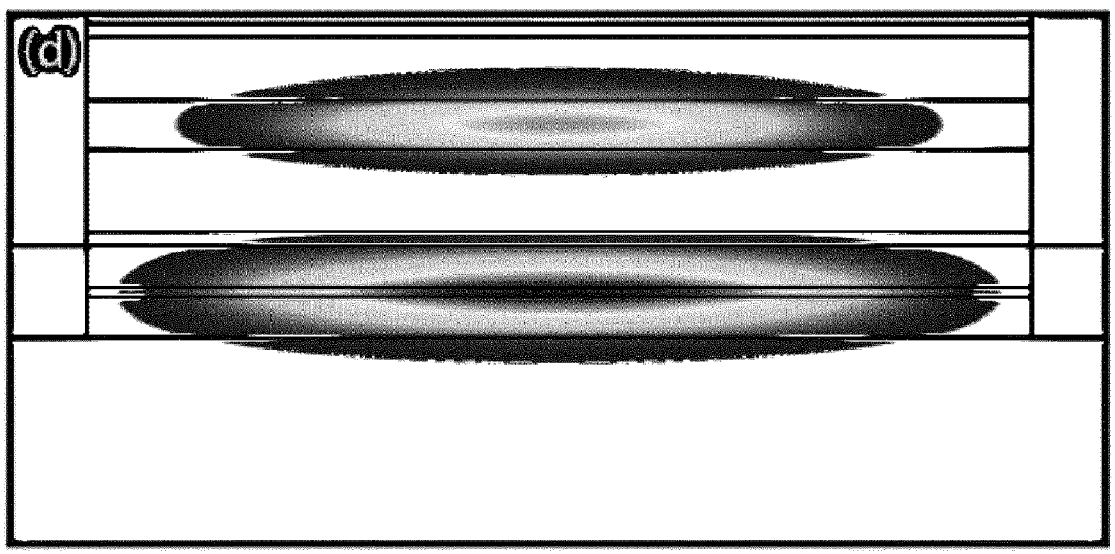
Figure 4E:
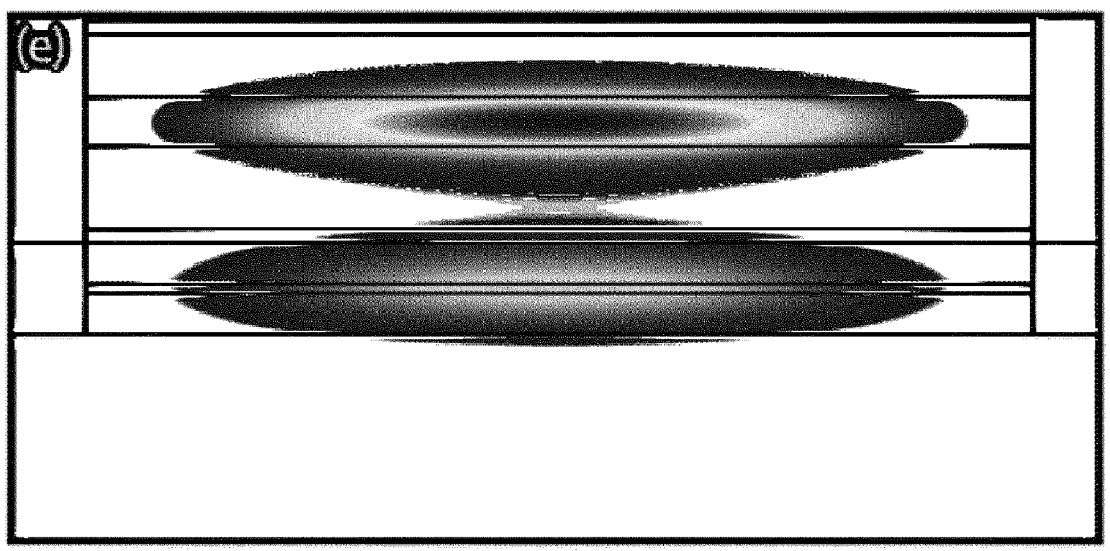

The vertical refractive index profile in the device along the growth axis G is displayed in FIG. 4A. The computed intensity profile of the two fundamental TE modes are displayed as well (Mode (+) and Mode (−)). The full two dimensional intensity profiles of these modes are reported in FIGS. 4D and 4E. These two modes result from the coupling of the fundamental modes of the two distinct waveguides (Mode 1 and Mode 2). The refractive index and optical intensity profiles of the latest are reported in FIGS. 4B and 4C.

Figure 4F:
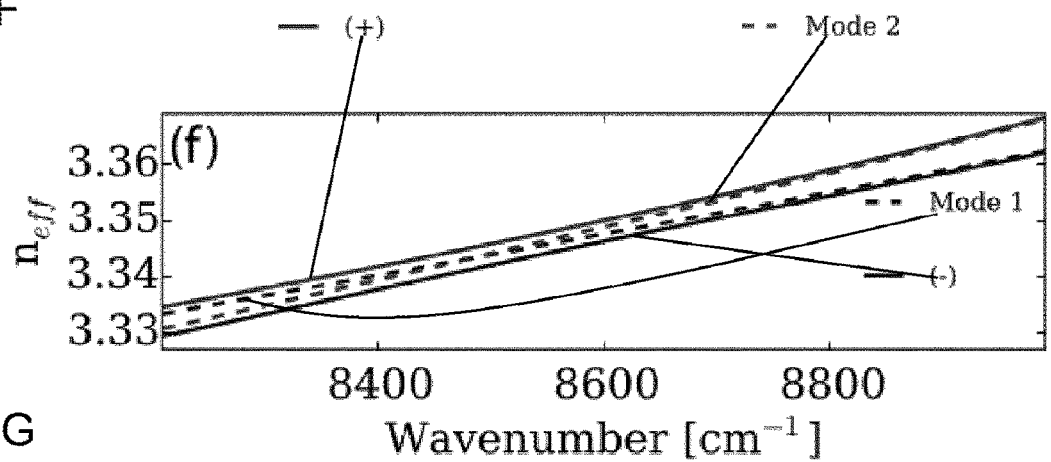
Figure 4G:
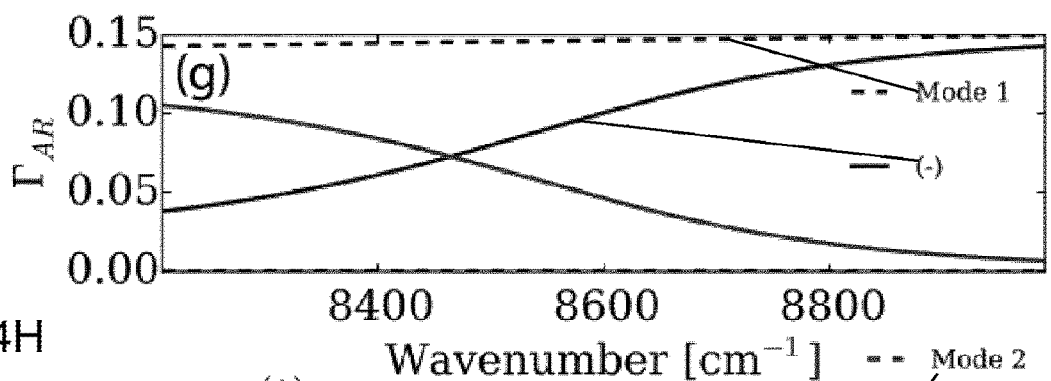
Figure 4H:
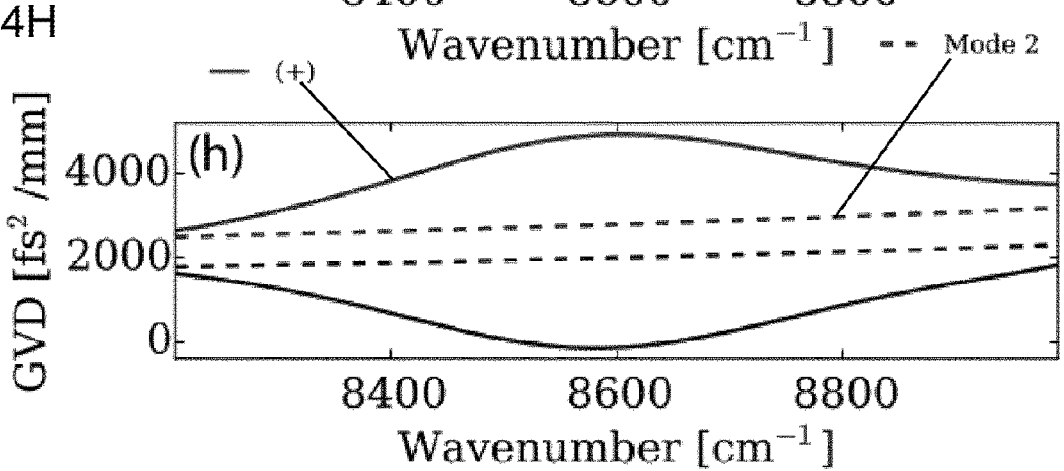

In FIG. 4F, the dispersion lines of the two uncoupled modes (Mode 1 and Mode 2) are reported with dashed lines while the dispersion of the coupled modes are reported with full lines.

Since passive core layer 4" (GaAs) has a refractive index larger than the refractive index of the active region layer 3", the antisymmetric mode (−) has a higher overlap factor with the active region while the symmetric mode is localized primarily in the passive core layer 4" (GaAs waveguide) (+). In that case, mode selection results from the overlap with the active region which is larger for the antisymmetric mode (see FIG. 4G). Our model predicts a dispersion for the proposed waveguide close to zero GVD.

For production of the waveguide heterostructures molecular beam epitaxy (MBE) and/or metalorganic chemical vapour deposition (MOCVD) can be used. A subsequent deposition of the layers onto the substrate 2 is carried out, depending of waveguide heterostructure embodiment 0, 0', 0".

LIST OF REFERENCE NUMERALS 0, 0' optical waveguide heterostructure (semiconductor)
1 electrode layer (metal)
2 substrate (semiconductor)
I active part
3 active region layer/primary core/QC layer/QD layer
active part bottom cladding
31 active part top cladding
wa width
II passive part
4 passive core layer
intercladding layer
41 passive part top cladding
42, 43, 44 additional passive part cladding
wp width
d, d' distance in direction of growth axis between 3 and 4
bc bottom cladding
5, 5' lateral regrowth layer

The invention claimed is:

1. A waveguide heterostructure for a semiconductor laser with an active part, comprising an active region layer depending on the type of semiconductor used, which is sandwiched between an electrode layer and a substrate, usable for dispersion compensation in a semiconductor laser frequency comb setup,
wherein a passive part, comprising at least an intercladding layer and a passive part top cladding surrounding a passive core layer, the passive part being inserted into the sandwich between the substrate and the electrode layer in a direction of a growth axis on top of or below the active part, wherein the intercladding layer, the passive part top cladding and the passive core layer are semiconductors and the refractive indices of the active region layer and of the passive core layer are greater than the refractive indices of the intercladding layer and of the passive part top cladding,
wherein the active part and the passive part together form a coupled waveguide by coupling between a primary waveguide, whose core is the active region layer, and a secondary waveguide, whose core is the passive core layer, said coupling changing what would otherwise be respective uncoupled fundamental modes of the primary and secondary waveguides into an antisymmetric mode and a symmetric mode, the antisymmetric mode having a lower group velocity dispersion than that of the fundamental mode of the primary waveguide as well as having a larger overlap with the active region layer than that of the symmetric mode, so that the antisymmetric mode is selected for lasing.

2. The waveguide heterostructure according to claim 1, wherein the active region layer is surrounded by an active part bottom cladding and an active part top cladding, wherein the refractive indices of the active part top and active part bottom claddings are greater than the refractive indices of the intercladding layer and of the passive part top cladding.

3. The waveguide heterostructure according to claim 2, wherein the active region layer is built of an active layer of a quantum cascade laser.

4. The waveguide heterostructure according to claim 3, wherein on top of the passive top cladding in the direction of the growth axis, averted the passive core layer, at least one additional passive part cladding is deposited, while at least one additional passive part cladding is placed underneath the intercladding layer, directly onto the active part top cladding.

5. The waveguide heterostructure according to claim 2, wherein the active region layer is built of an active layer of a ridge waveguide quantum dot laser.

6. The waveguide heterostructure according to claim 5, wherein between the substrate and the active part bottom cladding, averted the passive core layer, a bottom cladding is deposited, wherein the refractive index of the bottom cladding is less than the refractive indices of the active region layer, the passive core layer, the active part bottom cladding, and the active part top cladding.

7. The waveguide heterostructure according to claim 5, wherein the width of the active part is greater than the width of the passive part.

8. The waveguide heterostructure according to claim 5, wherein the height of the active region layer is less than half the height of the passive core layer.

9. The waveguide heterostructure according to claim 5, wherein the composition of the waveguide heterostructure is chosen according to:

| Layer | Material |
|---|---|
| passive top cladding | InP |
| passive core | InGaAs |
| passive bottom cladding | InP |
| active part top cladding | InGaAs |
| active part bottom cladding | InGaAs |
| substrate | InP. |

10. The waveguide heterostructure according to claim 2, wherein the active region layer is built of an active layer of an interband cascade laser.

11. The waveguide heterostructure according to claim 1, wherein the active region layer is built of a quantum cascade structure, an interband cascade structure, a quantum well structure, a quantum dash structure, a quantum dot structure or any other possible structure providing gain in semiconductor lasers.

12. The waveguide heterostructure according to claim 1, wherein the width of the active region layer is smaller than the width of the passive core layer in the direction perpendicular to the growth axis.

13. The waveguide heterostructure according to claim 1, further comprising a lateral regrowth layer surrounding the active part laterally parallel to the active region layer and a further lateral regrowth layer surrounding the passive part laterally parallel to the passive core layer, wherein the lateral regrowth layer and the further lateral regrowth layer are stacked.

14. The waveguide heterostructure according to claim 1, wherein the composition of the waveguide heterostructure is chosen according to:

| Layer | Material |
|---|---|
| passive top cladding | $Al_{0.35}Ga_{0.65}As$ |
| passive core layer | GaAs |
| intercladding layer | $Al_{0.35}Ga_{0.65}As$ |
| active part top cladding | $Al_{0.15}Ga_{0.85}As$ |
| active region layer | |
| active part bottom cladding | $Al_{0.15}Ga_{0.85}As$ |
| bottom cladding | $Al_{0.35}Ga_{0.65}As$ |
| Substrate | GaAs. |

15. The waveguide heterostructure according to claim 14, wherein the additional cladding layer comprises doped indium phosphide.

16. The waveguide heterostructure according to claim 1, wherein the distance between the centers of the active region layer and the passive core layer lies between 100 nm and 5 micron.

17. A semiconductor laser frequency comb setup, comprising at least one semiconductor laser with a waveguide heterostructure according to claim 1.

18. A method of manufacturing a waveguide heterostructure for a semiconductor laser, the method comprising:
providing a waveguide heterostructure comprising:
an active part, comprising an active region layer depending on the type of semiconductor used, which is sandwiched between an electrode layer and a substrate, and
a passive part, comprising at least an intercladding layer and a passive part top cladding surrounding a passive core layer, the passive part being inserted into the sandwich between the substrate and the electrode layer in the direction of the growth axis on top of or below the active part,
wherein the intercladding layer, the passive part top cladding and the passive core layer are semiconductors and the refractive indices of the active region layer and of the passive core layer are greater than the refractive indices of the intercladding layer and of the passive part top cladding, and
wherein the active part and the passive part together form a dual-coupled waveguide by coupling between a primary waveguide, whose core is the active region layer, and a secondary waveguide, whose core is the passive core layer, said coupling changing respective uncoupled fundamental modes of the primary and secondary waveguides into an antisymmetric mode and a symmetric mode, the antisymmetric mode having a lower group velocity dispersion than the fundamental mode of the primary waveguide as well as having a larger overlap with the active region layer than the symmetric mode, so that the antisymmetric mode is selected for lasing.

* * * * *